(12) United States Patent
Kruglick

(10) Patent No.: US 8,076,217 B2
(45) Date of Patent: Dec. 13, 2011

(54) CONTROLLED QUANTUM DOT GROWTH

(75) Inventor: Ezekiel Kruglick, Poway, CA (US)

(73) Assignee: Empire Technology Development LLC, Wilmington, DE (US)

( * ) Notice: Subject to any disclaimer, the term of this patent is extended or adjusted under 35 U.S.C. 154(b) by 54 days.

(21) Appl. No.: 12/435,213

(22) Filed: May 4, 2009

(65) Prior Publication Data

US 2010/0276666 A1 Nov. 4, 2010

(51) Int. Cl.
*H01L 21/20* (2006.01)
(52) U.S. Cl. ............... 438/478; 438/479; 438/962
(58) Field of Classification Search ............ 438/478, 438/479, 962; 977/890; 257/E29.168, E21.09
See application file for complete search history.

(56) References Cited

U.S. PATENT DOCUMENTS

| | | | | |
|---|---|---|---|---|
| 4,660,066 A * | 4/1987 | Reid | ............... | 257/777 |
| 5,354,707 A | 10/1994 | Chapple-Sokol et al. | .... | 437/106 |
| 5,888,885 A * | 3/1999 | Xie | ............... | 438/493 |
| 5,923,046 A * | 7/1999 | Tezuka et al. | ............... | 257/24 |
| 6,074,936 A | 6/2000 | Ro et al. | ............... | 438/504 |
| 7,005,669 B1 | 2/2006 | Lee | ............... | 257/21 |
| 2002/0075920 A1 * | 6/2002 | Spruytte et al. | ............... | 372/45 |
| 2004/0038440 A1 * | 2/2004 | Hatori | ............... | 438/47 |
| 2004/0051159 A1 * | 3/2004 | Terashima | ............... | 257/506 |
| 2004/0171236 A1 * | 9/2004 | Shih et al. | ............... | 438/478 |
| 2006/0056472 A1 * | 3/2006 | Ogura | ............... | 372/43.01 |
| 2007/0138460 A1 * | 6/2007 | Choi et al. | ............... | 257/13 |
| 2009/0003841 A1 * | 1/2009 | Ghidini et al. | ............... | 398/186 |

OTHER PUBLICATIONS

International Search Report and Written Opinion dated Nov. 12, 2010, International Application No. PCT/US2010/33428, filed May 3, 2010, pp. 7.
Kiravittaya, Suwit, et al., "Advanced Quantum Dot Configurations", Rep. Prog. Phys. 72 (046502), Mar. 16, 2009, pp. 34.
Lin, Tse-Chi, et al., "Silicon-germanium spherical quantum dot infrared photodetectors prepared by the combination of bottom-up and top-down technologies", J. Vac. Sci. Technol. B, vol. 22, No. 1, Jan./Feb. 2004, pp. 7.
Nayfeh, Ammar, "Heteroepitaxial Growth of Relaxed Germanium on Silicon", Dissertation online Jun. 2006, retrieved from the Internet at: http://cis.stanford.edu/~saraswat/Thesis/Anunar%20Nayfeh%20Thesis.pdf.

* cited by examiner

*Primary Examiner* — William M. Brewster
(74) *Attorney, Agent, or Firm* — Dorsey & Whitney LLP

(57) ABSTRACT

The present disclosure generally relates to techniques for controlled quantum dot growth as well as a quantum dot structures. In some examples, a method is described that includes one or more of providing a substrate, forming a defect on the substrate, depositing a layer on the substrate and forming quantum dots along the defect.

18 Claims, 6 Drawing Sheets

CONTROLLED QUANTUM DOT GROWTH

BACKGROUND

A quantum dot is a semiconductor whose excitons are confined in all three spatial dimensions. Quantum dots have properties that are between those of bulk semiconductors and those of discrete molecules. Quantum dots may be used in myriad applications, for example, in transistors, solar cells, LEDs, diode layers, as agents for medical imaging, for use as qubits and for use as memory.

Quantum memory may operate at very high densities and very low power and is used in many applications. Fabrication of such memory, however, remains a challenge. One general manner of fabrication involves deposition of thin films on substrates.

BRIEF DESCRIPTION OF THE FIGURES

The foregoing and other features of the present disclosure will become more fully apparent from the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying drawings, in which:

DETAILED DESCRIPTION

Figure 1:
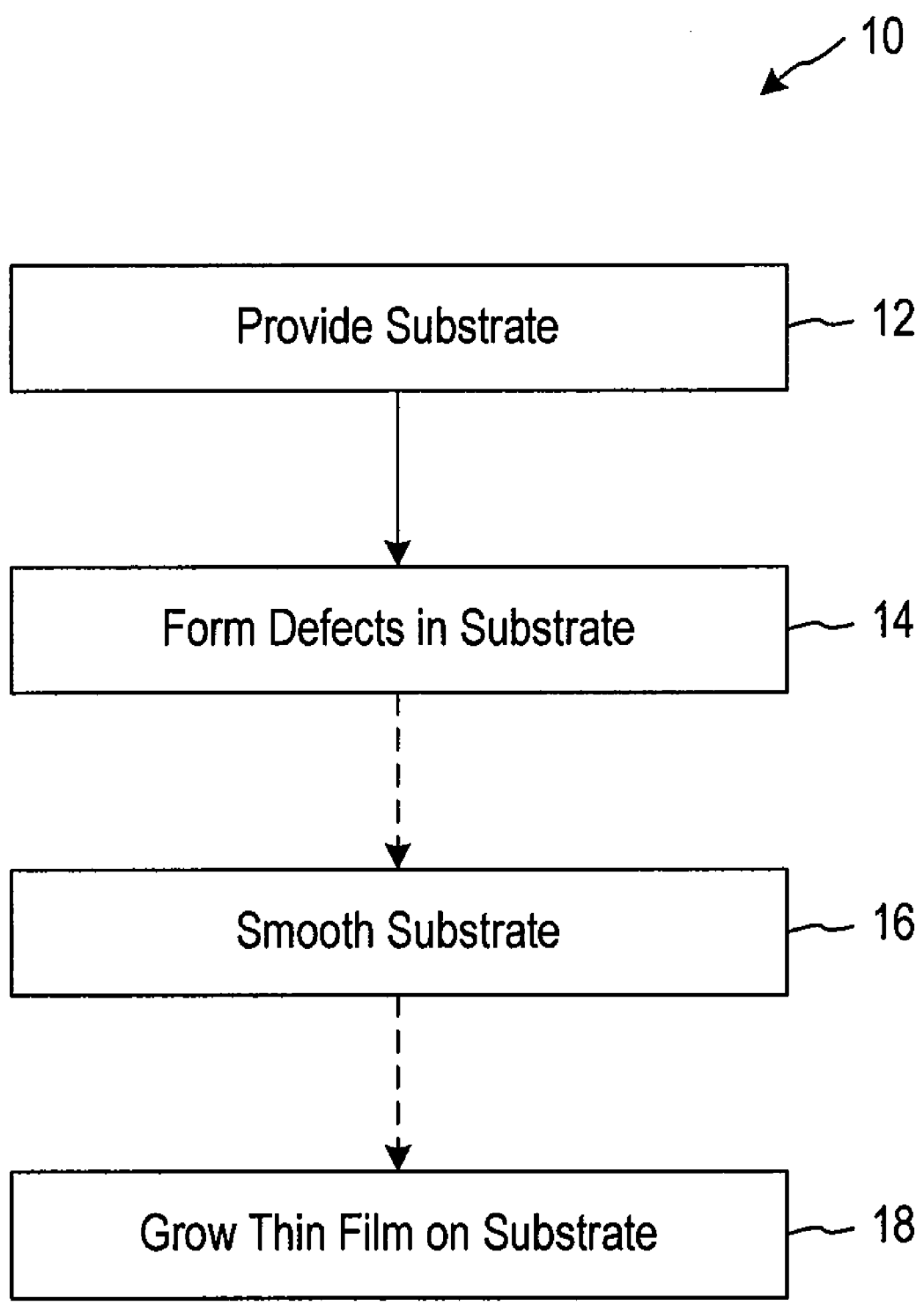
FIG. 1 illustrates an example of a general method for controlled quantum dot growth, in accordance with some examples of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, may be arranged, substituted, combined, separated, and designed in a wide variety of different configurations, all of which are explicitly and implicitly contemplated herein.

This disclosure is drawn, inter alia, to methods, apparatus, computer programs and systems related to controlled quantum dot growth. More specifically, various methods and systems for controlling patterns of strain and defects to control Stranski-Krastanov type quantum dot growth are provided. Generally, in some examples, defects (or linear disorder regions) may be created along predefined geometries to in turn form quantum dots on those geometries. In some examples, stressed material layers may be used to generate quantum dot growth sites. In other examples, a material defect may be generated in the substrate to generate quantum dot sites. While the disclosure may make specific reference to growing quantum dots for memory or computing, it is to be appreciated that the systems and methods disclosed herein may be used in any material system where localized stresses may be patterned as described.

There are several modes that may be used for growing thin films epitaxially at a crystal surface or interface. The three primary deposition modes are Volmer-Weber (VW) growth, Frank-van der Merwe (FM) growth, and Stranski-Krastonov (SK) growth. VW growth involves island formation followed by merging of the islands to form a layer, and is characteristic of thin homogenous metal films. FW growth occurs one layer at a time and typically happens with deposition of highly surface mobile chemistries. SK growth, also referred to as "layer-plus-island growth," follows a two step process comprising growth of layers of adsorbates followed by nucleation and coalescence of adsorbate islands. The first step, growth of layers of adsorbates, typically comprises growth of a film of adsorbates, up to several monolayers thick, grown in a layer-by-layer fashion on a crystal substrate. Beyond a certain layer thickness, the level of which depends on the strain and the chemical potential of the deposited film, the second step, nucleation and coalescence of adsorbate islands, is triggered for continued growth. SK growth thus is a mixed deposition form where mobile species form layers but the mobility is not high enough for uniformity and islands form during deposition.

Coherent island formation during SK growth may be used as a means for fabricating epitaxial nanoscale structures such as quantum dots. Controlling of island organization, density, and size on a substrate typically relies on etching away or walling off areas, for example using nanolithography followed by deep reactive ion etching. Generally, to try to pattern the quantum dot generation, layers are produced with random dots and either parts of the layer are removed or pits are produced in the layer. Dots then grow on the pits, typically with more than one dot forming in each pit.

The growth of epitaxial (homo or hetero) thin films on a single crystal surface depends on the interaction strength between adatoms and the surface. Most epitaxial growth occurs via a vapor phase technique such as molecular beam epitaxy (MBE). VW growth is characterized as island-to-layer growth, FM growth is characterized as layered growth, and SK growth is characterized as an intermediary process between VW growth and FM growth. In VW growth, adatom-adatom interactions are stronger than those of the adatom with the surface, leading to the formation of three-dimensional adatom clusters or islands. Growth of these clusters, along with coarsening, causes rough multi-layer films to grow on the substrate surface. In contrast, during FM growth, adatoms attach preferentially to surface sites resulting in atomically smooth, fully formed layers; this is thought of as two dimensional growth where complete films form prior to growth of subsequent layers. SK growth is a process intermediate to VW growth and FM growth and is characterized by both two-dimensional layer growth and three-dimensional island growth. Transition from the layer-by-layer growth to island-based growth occurs at a layer thickness which may be dependent on chemical and physical properties, such as surface energies and lattice parameters, of the substrate and film. Initial film growth may follow a Frank-van der Merwe (FM) mechanism, i.e. positive differential, non-trivial amounts of strain energy accumulate in the deposited layers. At a certain height (or film thickness), this strain may induce a sign reversal in the chemical potential, i.e. negative differential, leading to a switch in the growth mode. At this point it may be energetically favorable to nucleate islands and further growth occurs by a Volmer-Weber (VW) type mechanism.

The transition may be triggered by Asaro-Tiller Grinfield (ATG) instability, also referred to as the Grinfeld instability. ATG instability is an elastic instability. If there is a mismatch between the lattice sizes of the growing film and the supporting crystal, elastic energy will be accumulated in the growing film. At some height, the free energy of the film may be lowered if the film breaks into isolated islands, where the tension may be relaxed laterally. The height where the energy of the film may be lowered by breaking into isolated islands depends on Young moduli, mismatch size, and surface tensions. The ability to control this transition either spatially or temporally enables manipulation of physical parameters of the nanostructures, like geometry and size, which, in turn, may alter their electronic or optoelectronic properties (i.e. band gap).

SK growth is interesting to quantum dot deposition because the balance of forces is delicate enough that growth on a surface with a poor lattice match to the depositing material may result in pseudo random growth of quantum dot islands if the process is stopped quickly. The locations of such islands may not be controllable or predictable. However, predictable levels of stress may facilitate nucleation of SK grown quantum dots at generally predetermined locations. This happens because the SK process occurs in conditions where agglomeration and spreading forces are approximately the same such that local stress or defect energy is sufficient to select for island formation.

In accordance with various examples discussed herein, stress and/or defects (also referred to as linear disorder regions) may be placed along a substrate to control or add spatial predictability to the transition from layer growth to island growth. For example, prestressed deposition elements may be provided in controlled patterns of strain and defects. Using such predefined defects, the position of quantum dots may be directed and confined. In various examples, methods described herein thus may provide lithographically specific quantum dots and/or stacks of quantum dots.

In specific examples, methods described herein may be used for growing Germanium/Silicon (GeSi) quantum dots on Silicon (Si). In alternative examples, other substrates and materials may be used. Processes described herein may facilitate lithographically specified quantum dots or stacks of quantum dots that may be suitable, for example, for super-high-density memory or computation within the temperature and material compatibility requirements of standard complementary metal-oxide semiconductor (CMOS) processing.

FIG. 1 illustrates an example of a general method 10 for controlled quantum dot growth, in accordance with some examples of the present disclosure. As shown, a substrate may be provided at operation 12. Defects may be formed in the substrate at operation 14, as described more fully below. In some examples, the substrate with defects formed thereon may be smoothed at operation 16. A thin film layer may be grown on the substrate at operation 18.

In some examples, growth may be done using molecular beam epitaxy (MBE). Molecular beam epitaxy may take place in high vacuum or ultra high vacuum (10-8 Pa). MBE generally has a slow deposition rate (typically less than 1000 nm per hour), which may facilitate epitaxial film growth. The slow deposition rates generally call for proportionally better vacuum to achieve the same impurity levels as other deposition techniques. In solid-source MBE, ultra-pure elements such as gallium and arsenic may be heated in separate quasi-knudsen effusion cells until they begin to slowly sublimate. The gaseous elements then may condense on the wafer, where they may react with each other.

In the example of gallium and arsenic, single-crystal gallium arsenide may be formed. During MBE (or other quantum dot growth), the substrate temperature may be controlled. An example substrate temperature is 620° C. In a specific example, the substrate may be silicon and the thin film layer may be germanium. Quantum dots may form along the defects formed in the substrate.

A quantum dot recipe may use a combination of temperature and surface stoichiometry. Temperatures and surface characteristics may be determined where the deposited species (for the thin film layer) may be mobile but not so mobile as to overcome the formed defects. Accordingly, the species may accumulate at the defect. Using processes described herein, quantum dot nanostructures may be formed having a high degree of spatial ordering including predictability in size and shape as well as in spatial relationship of the quantum dots on the substrate. The processes described herein including forming of defects to influence position of quantum dots may be used with any suitable quantum dot recipe.

In some examples, defects may be formed by placing stressed material layers. The stressed material layers may be provided by etching using a mask. Etching may be used in microfabrication to chemically remove layers from the surface of a wafer during manufacturing. Etching may be done, for example, by liquid-phase ("wet") or plasma-phase ("dry") etching. For etch steps, part of the substrate may be protected from the etchant by a masking material which resists etching. Any suitable masking material may be used. In some examples, the masking material may be photoresist which has been patterned using photolithography. In other examples, a more durable mask, such as silicon nitride, may be used. The etchant used may be selected based on the substrate to be etched and may include wet etchants, plasma etchants, or other. For example, suitable wet etchants include nitric acid and hydrofluoric acid for a silicon substrate may be etched using nitric acid and hydrofluoric acid, 85% phosphoric acid at 180° C. for a silicon nitride substrate, or hydrochloric acid and nitric acid for indium tin oxide. Accordingly, a mask may be formed to reflect a desired geometry for etching on a substrate. In some examples, a single mask may be used to generate large numbers of quantum dots in lithographically defined positions. Placement of edges (or defects) facilitates manufacture of tight linear or grid arrays.

Figure 2:
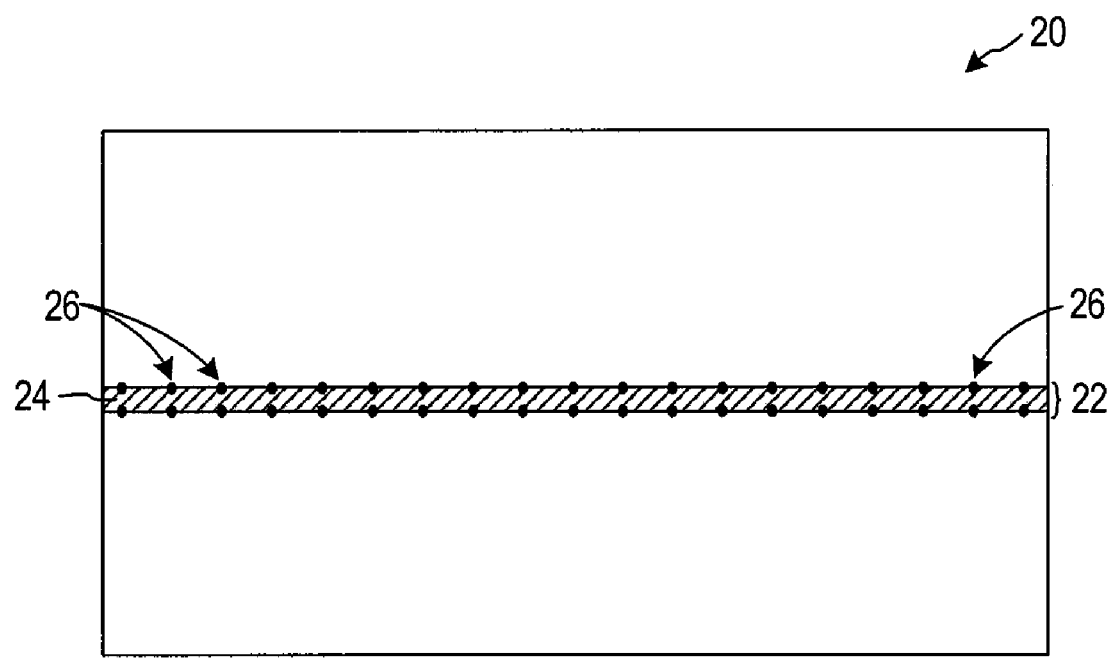
FIG. 2 illustrates a top view of a substrate with a linear defect, in accordance with some examples of the present disclosure.

FIG. 2 illustrates a top view of a substrate with a linear defect, in accordance with some examples of the present disclosure. The etched area may then be filled, for example, with silicon. Thus, as shown in FIG. 2, a substrate 20, such as a silicon wafer, may include a stressed polysilicon trench 22. The trench 22 may be filled with silicon 24. The substrate may be smoothed using chemical mechanical planarization/polishing (CMP) or other suitable technique. A small area, corresponding to the etched and filled area, may remain with high stress (and crystalline disorder). A thin film layer may then be grown on the substrate, for example using MBE silicon growth. The growth may be on the order of 0.25 to 2.5 microns and provides a surface with a largely uniform crystalline geometry except defects and stress over the deposition area. Quantum dots 26 may form along the defect area. It is to be appreciated that in FIG. 2, the quantum dots 26 are highly exaggerated, and the defects, stress, and quantum dots are typically invisible to the human eye.

In other examples, a defect such as a crack, seam, or divot may be formed in the underlying substrate. MBE growth may be done on the substrate. The resultant structure is a flat but defective surface.

Figure 3:
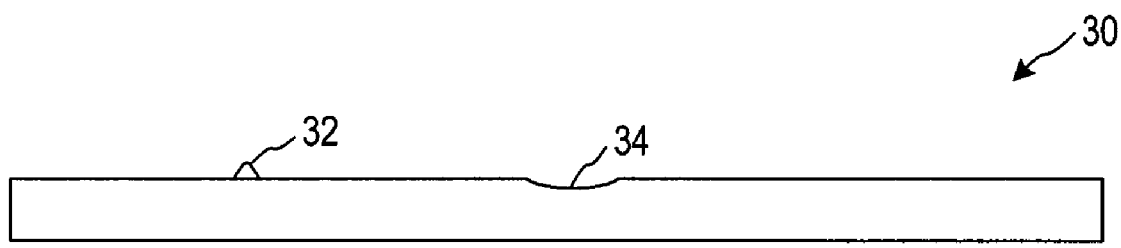
FIG. 3 illustrates a substrate having a seam defect and a divot defect, in accordance with some examples of the present disclosure.

FIG. 3 illustrates a substrate 30 having a seam defect 32 and a divot defect 34, in accordance with some examples of the present disclosure. Defects may be formed along predefined geometries using conventional substrate processing. For example, defects may be formed in silicon substrates using conventional silicon processing. For example, in one implementation, a substantially linear defect may be formed such that a line of quantum dots may be grown over the defect. Generally, quantum dots will be positioned predominantly at edges of the defect.

Figure 4A:
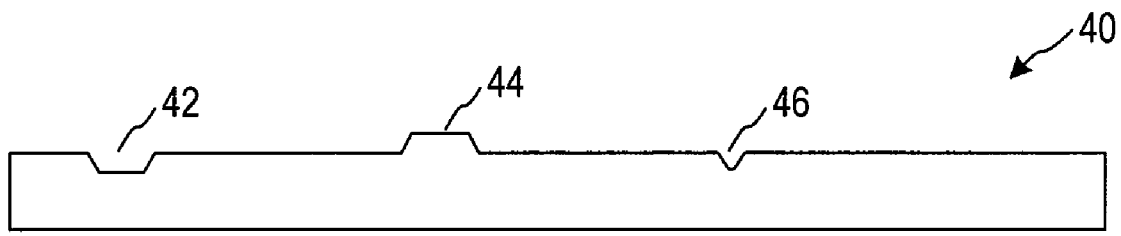
FIG. 4a illustrates a substrate with a plurality of linear defects, in accordance with some examples of the present disclosure.

FIG. 4a illustrates a substrate 40 with a plurality of linear defects, in accordance with some examples of the present disclosure. A substantially linear defect may be formed as a trench 42, or as a deposited line 44. In some implementations, the trench 42 may be relatively shallow but sufficiently deep that defects are not formed intermediate edges of the trench. For example, in some implementations, the trench 42 may be more than approximately 100 nm. The width of the trench may be any suitable width. Generally, quantum dots may form along both edges of the trench. Thus, the width of the trench may dictate relative placement of two lines of quantum dots. A very narrow trench 46 may, for example, be on the order of 2 microns, and may be formed wherein a single line of quantum dots may be formed. Regardless of depth or width, the trench may be filled with, for example, GeSi or polysilicon. A conventional chemical polish may be used to flatten the surface. In alternative implementations, the trench may not be filled. In some examples, a defect comprising a deposited line 44 may be a poly-silicon line. The height of the line 44 forms topography at its edges and that topography facilitates SK growth. Such defects may generally be referred to as a material deposited on a surface of the substrate.

Figure 4B:
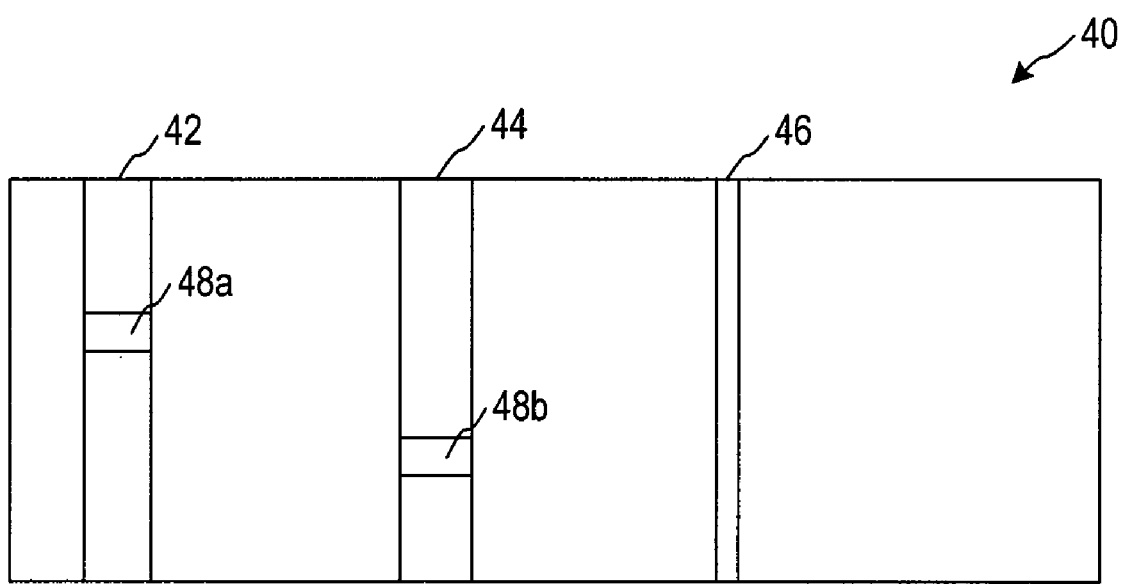
FIG. 4b illustrates a top view of a substrate with a wide trench defect, a deposited line defect, and a narrow trench defect, wherein defects are formed on the wide trench defect and the deposited line defect, in accordance with some examples of the present disclosure.

FIG. 4b illustrates a top view of a substrate with a wide trench defect, a deposited line defect, and a narrow trench defect, wherein defects are formed on the wide trench defect and the deposited line defect, in accordance with some examples of the present disclosure. Defects may be formed along the lines 48a and 48b of FIG. 4b. Deposited heights 48a may be provided along a trench 42 and etched or otherwise provided and divots 48b may be provided along a deposited line 44. Alternatively, divots may be provided along a trench at a depth deeper than the trench and deposits may be provided along a deposited line at a height greater than the deposited line. The trench or deposited line, or other defect, thus may be non-uniform. In a further example, lines may be patterned with appropriate spacing to form geometry for a memory grid.

Figure 5:
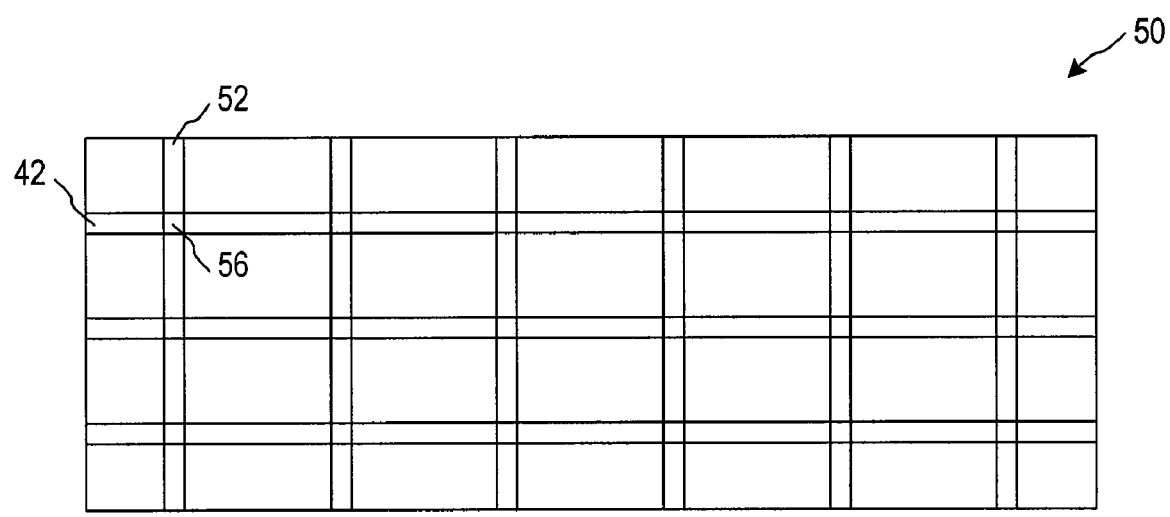
FIG. 5 illustrates a top view of a substrate with a grid defect, in accordance with some examples of the present disclosure.

FIG. 5 illustrates a top view of a substrate with a grid defect, in accordance with some examples of the present disclosure. The grid defect may be formed by a plurality of vertically extending linear defects 52 and a plurality of horizontally extending linear defects 54. Squares 56 may be formed at the intersection of the vertically extending linear defects 52 and the horizontally extending linear defects 54. The squares 56 may be shaped such that quantum dots are formed in the corners of the squares.

Accordingly, a plurality of geometries may be used to provide quantum dots in a predefined pattern. For example, as discussed, substantially linear defects may be formed, grid defects may be formed, and square defects may be formed. Combinations of defects of different geometries may be formed.

Using any of these examples, quantum dots may be grown on the defect-laden substrate using recipes known in the art or hereafter developed. The recipe may be selected to produce quantum dots of similar density and size as in conventional self-assembled SK growth but along the predicted patterns based on the geometry imparted using the methods described herein. The quantum dots may range, for example, in size from approximately 2 nm to 10 nm, from approximately 10 nm to approximately 50 nm, or from approximately 50 nm to approximately 100 nm. The resultant structure may be substantially flat and, thus, electronics may be built around the quantum dots without further etching.

In one implementation, a silicon substrate may be provided with at least one defect and germanium quantum dots are grown thereon. In various implementations, methods as described herein may be used to grow gallium nitride quantum dots, InGaAs quantum dots, or other materials of quantum dots. Generally, the methods described herein may be used for any form of quantum dot deposition.

In further implementations, a plurality of layers may be grown, each having quantum dots. Thus, iterations of deposition may lead to stacks of quantum dots. For example, a layer of silicon may be grown epitaxially on top of the germanium quantum dots and the quantum dot process repeated to form sequential vertically stacked quantum dots on top of each other. In some examples, each silicon layer may be approximately 0.25 μm to approximately 0.5 μm. Generally, after initial growth of quantum dots, the quantum dots propagate the defect through subsequent thin (for example 10-12 nm) layer depositions. The silicon interlayer thickness may be optimized using routine experimentation looking at the influence of the silicon interlayer thickness, the island position alignment, and the coarsening of the islands from one buried island layer to the next.

In alternative examples, circuitry may be laid on a substrate and quantum dots then grown. Such examples may be used where extreme temperatures are not used Accordingly, processes and methods described herein may integrated into a thermal budget for electronics manufacture at any suitable processing operation including annealing, ion implantation, and others.

Figure 6:
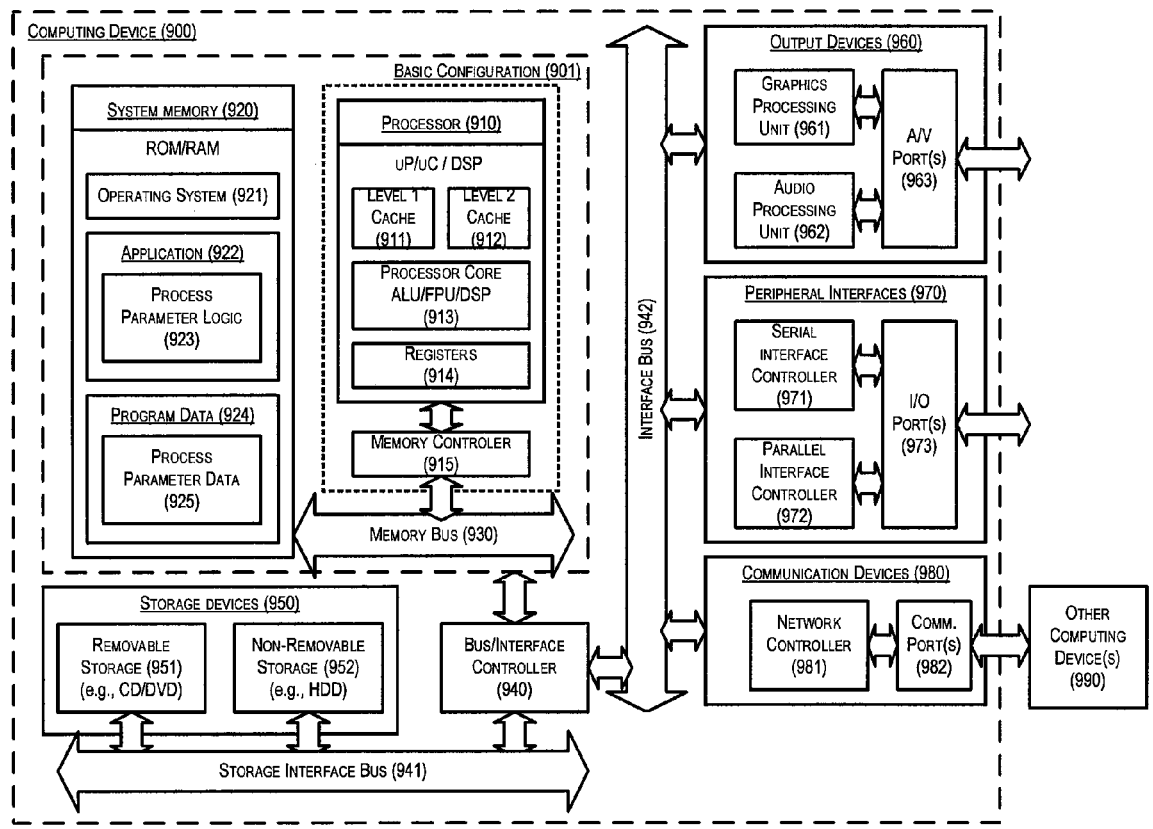
FIG. 6 is a block diagram illustrating an example computing device that is arranged for quantum dot growth in accordance with the present disclosure.

FIG. 6 is a block diagram illustrating an example computing device 900 that is arranged for quantum dot growth in accordance with the present disclosure. In a very basic configuration 901, computing device 900 typically includes one or more processors 910 and system memory 920. A memory bus 930 may be used for communicating between the processor 910 and the system memory 920.

Depending on the desired configuration, processor 910 may be of any type including but not limited to a microprocessor (μP), a microcontroller (μC), a digital signal processor (DSP), or any combination thereof. Processor 910 may include one more levels of caching, such as a level one cache 911 and a level two cache 912, a processor core 913, and registers 914. An example processor core 913 may include an arithmetic logic unit (ALU), a floating point unit (FPU), a digital signal processing core (DSP Core), or any combination thereof. An example memory controller 915 may also be used with the processor 910, or in some implementations the memory controller 915 may be an internal part of the processor 910.

Depending on the desired configuration, the system memory 920 may be of any type including but not limited to volatile memory (such as RAM), non-volatile memory (such as ROM, flash memory, etc.) or any combination thereof. System memory 920 may include an operating system 921, one or more applications 922, and program data 924. Application 922 may include a process parameter logic 923 for controlling process parameters for a method of quantum dot growth. Program Data 924 includes process parameter data including, for example, material deposition rates, temperature controls, defect formation protocol, or others 925. In some examples, temperature controls may control substrate temperature. In some examples, defect formation protocol may include etching parameters. In some embodiments, application 922 may be arranged to operate with program data 924 on an operating system 921 such that the computer system may be operably associated with a system for quantum dot growth and may control process parameters of the system for quantum dot growth. This described basic configuration is illustrated in FIG. 6 by those components within dashed line 901.

Computing device 900 may have additional features or functionality, and additional interfaces to facilitate communications between the basic configuration 901 and any required devices and interfaces. For example, a bus/interface controller 940 may be used to facilitate communications between the basic configuration 901 and one or more data storage devices 950 via a storage interface bus 941. The data storage devices 950 may be removable storage devices 951, non-removable storage devices 952, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 900. Any such computer storage media may be part of device 900.

Computing device 900 may also include an interface bus 942 for facilitating communication from various interface devices (e.g., output interfaces, peripheral interfaces, and communication interfaces) to the basic configuration 901 via the bus/interface controller 940. Example output devices 960 include a graphics processing unit 961 and an audio processing unit 962, which may be configured to communicate to various external devices such as a display or speakers via one or more A/V ports 963. Example peripheral interfaces 970 include a serial interface controller 971 or a parallel interface controller 972, which may be configured to communicate with external devices such as input devices (e.g., keyboard, mouse, pen, voice input device, touch input device, etc.) or other peripheral devices (e.g., printer, scanner, etc.) via one or more I/O ports 973. An example communication device 980 includes a network controller 981, which may be arranged to facilitate communications with one or more other computing devices 990 over a network communication link via one or more communication ports 982.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 900 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 may also be implemented as a personal computer including both laptop computer and non-laptop computer configurations.

Figure 7:
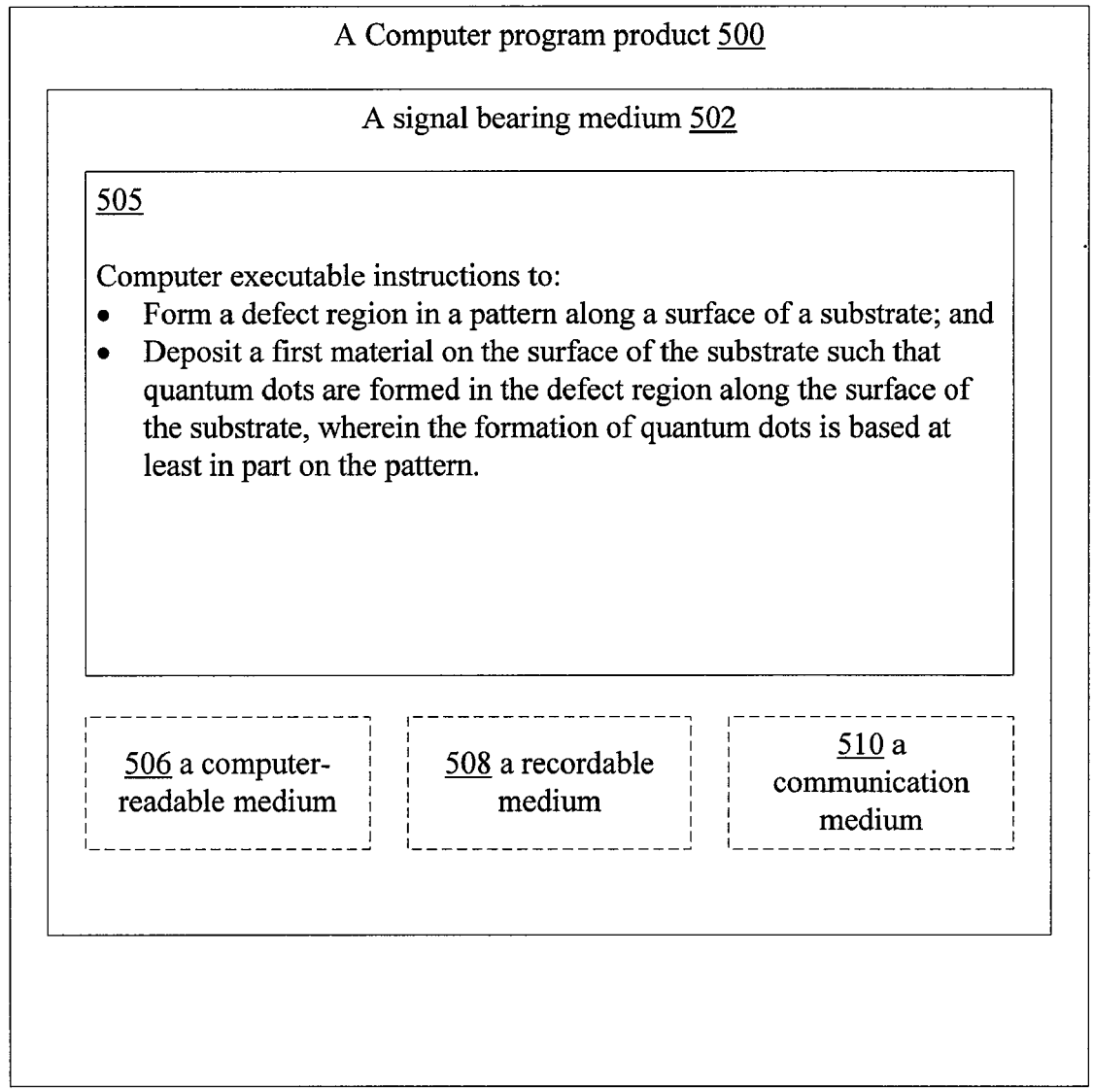
FIG. 7 illustrates a block diagram of an example computer program product in accordance with the present disclosure.

FIG. 7 illustrates a block diagram of an example computer program product 500 in accordance with the present disclosure. In some examples, as shown in FIG. 7, computer program product 500 includes a signal bearing medium 502 that may also include computer executable instructions 505. Computer executable instructions 505 may be arranged to provide instructions for a quantum dot growth procedure. Such instructions may include, for example, instructions relating to forming a defect region in a pattern along a surface of a substrate. Such instructions further may include, for example, instructions relating to depositing a first material on the surface of the substrate such that quantum dots are formed in the defect region along the surface of the substrate, wherein the formation of quantum dots is based at least in part on the pattern. Generally, the computer executable instructions may include instructions for performing any steps of the method for quantum dot growth described herein.

Also depicted in FIG. 7, in some examples, computer product 500 may include one or more of a computer readable medium 506, a recordable medium 508 and a communications medium 510. The dotted boxes around these elements may depict different types of mediums that may be included within, but not limited to, signal bearing medium 502. These types of mediums may distribute computer executable instructions 505 to be executed by computer devices including processors, logic and/or other facility for executing such instructions. Computer readable medium 506 and recordable medium 508 may include, but are not limited to, a flexible disk, a hard disk drive (HDD), a Compact Disc (CD), a Digital Video Disk (DVD), a digital tape, a computer memory, etc. Communications medium 510 may include, but is not limited to, a digital and/or an analog communication medium (e.g., a fiber optic cable, a waveguide, a wired communication link, a wireless communication link, etc.).

Generally, methods and systems described herein may be useful for high density RAM, other memory applications, optics, biological applications, and other applications. Quantum dots may be useful for optical applications due to their theoretically high quantum yield. In electronic applications quantum dots may operate like a single-electron transistor and show the Coulomb blockade effect. Quantum dots may be useful for implementations of qubits for quantum information processing.

The ability to tune the size of quantum dots may be advantageous for many applications. Accordingly, in addition to placement along the predefined geometry, in accordance with some examples provided herein, size of the quantum dots may be selected for specific applications. For instance, larger quantum dots have spectra shifted towards the red compared to smaller dots, and exhibit less pronounced quantum properties. Conversely the smaller particles allow one to take advantage of quantum properties. Quantum dots may have superior transport and optical properties, and may be used in diode lasers, amplifiers, and biological sensors. High-quality quantum dots may be used for optical encoding and multiplexing applications due to their broad excitation profiles and narrow/symmetric emission spectra. Quantum dots have far-reaching potential for the study of intracellular processes at the single-molecule level, high-resolution cellular imaging, long-term in vivo observation of cell trafficking, tumor targeting, and diagnostics.

The present disclosure is not to be limited in terms of the particular examples described in this application, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular examples only, and is not intended to be limiting.

The present disclosure generally relates to systems and methods for controlled quantum dot growth. In one example, a method for quantum dot growth is provided. The method includes providing a substrate, forming a defect on the substrate, depositing a first material on the substrate, and forming quantum dots along the defect. In various implementations, forming a defect on the substrate may comprise forming a trench in the substrate, depositing a line on the substrate, forming a square on the substrate, or forming a grid on the substrate.

In examples wherein the defect is a trench, the trench may be formed by etching and the method may further include filling the trench with a material and smoothing the substrate after the trench has been filled with the material. In various examples, the substrate may be silicon, the first material may be germanium, and the second material may be germanium-silicon. In further examples, the first material may be deposited using molecular beam epitaxy.

In yet further examples, a thin film layer may be formed over the deposited material and the method may include depositing the first material over the thin film layer. In some examples, the thin film layer and the substrate may be the same material. In some examples, the thin film layer may be from about 0.25 µm to about 0.5 µm.

There is little distinction left between hardware and software implementations of aspects of systems; the use of hardware or software is generally (but not always, in that in certain contexts the choice between hardware and software may become significant) a design choice representing cost vs. efficiency tradeoffs. There are various vehicles by which processes and/or systems and/or other technologies described herein may be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein may be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically matable and/or physically interacting components and/or wirelessly interactable and/or wirelessly interacting components and/or logically interacting and/or logically interactable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range may be easily recognized as sufficiently describing and enabling the same range being broken down into at least equal halves, thirds, quarters, fifths, tenths, etc. As a non-limiting example, each range discussed herein may be readily broken down into a lower third, middle third and upper third, etc. As will also be understood by one skilled in the art all language such as "up to," "at least," "greater than," "less than," and the like include the number recited and refer to ranges which may be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method for quantum dot growth comprising:
   forming a trench in a substrate;
   filling the trench with a material to form a defect region along an interface between the material and the substrate on a surface of the substrate; and
   growing quantum dots in the defect region, wherein the growth is based at least in part on a location of the defect region, such that the growth of quantum dots is substantially confined to the defect region.

2. The method of claim 1, wherein the substrate comprises silicon, and the material comprises germanium.

3. The method of claim 1, wherein the trench has a first edge and a second edge and wherein quantum dots are formed predominantly along the first edge and the second edge.

4. The method of claim 1, wherein the substrate comprises a silicon wafer and wherein the material comprises germanium silicon.

5. The method of claim 4, further comprising smoothing the substrate after the trench has been filled with the material.

6. A computer accessible medium having stored thereon computer executable instructions for performing a procedure for quantum dot growth the procedure comprising:
   forming a trench in a substrate;
   filling the trench with a first material to form a defect region along an interface between the material and the substrate on a surface of a substrate; and
   depositing a second material on the surface of the substrate such that quantum dots are formed in the defect region, wherein the quantum dots are substantially confined to the defect region.

7. The computer accessible medium of claim 6, wherein the procedure further comprises smoothing the substrate after the trench has been filled with the first material.

8. The computer accessible medium of claim 6, wherein depositing a second material on the substrate comprises depositing the second material using molecular beam epitaxy.

9. The method of claim 1, wherein the material comprises a first material, and wherein said growing comprises depositing a second material on the surface of the substrate such that quantum dots are formed in the defect region, while a second region removed from the defect region is substantially free of quantum dots.

10. The method of claim 1, wherein forming a trench comprises forming a linear trench.

11. The method of claim 1, wherein the material comprises polysilicon.

12. The method of claim 1, further comprising forming a pattern of defect regions, wherein the pattern comprises a grid.

13. The method of claim 1, wherein growing comprises growing quantum dots according to the Volmer-Weber growth mode, the Frank-van der Merwe growth mode, the Stranski-Krastonov growth mode, or a combination thereof.

14. The method of claim 1, wherein said filling the trench occurs before said growing quantum dots.

15. The method of claim 9, wherein depositing a material on the substrate comprises depositing a material using molecular beam epitaxy.

16. The method of claim 9, further comprising forming a thin film layer over the deposited material and depositing another material on the thin film layer.

17. The method of claim 16, wherein the substrate and the thin film layer are formed of the same material.

18. The method of claim 16, wherein the thin film layer has a thickness between about 0.25 µm to about 0.5 µm.

* * * * *

UNITED STATES PATENT AND TRADEMARK OFFICE
CERTIFICATE OF CORRECTION

PATENT NO. : 8,076,217 B2  
APPLICATION NO. : 12/435213  
DATED : December 13, 2011  
INVENTOR(S) : Kruglick Page 1 of 1

It is certified that error appears in the above-identified patent and that said Letters Patent is hereby corrected as shown below:

On the title page, item (56), under "OTHER PUBLICATIONS", in Column 2, Line 13, delete "Anunar%" and insert -- Ammar% --, therefor.

In Fig. 5, Sheet 4 of 6, delete Tag "42" and insert Tag -- 54 --, therefor.

In Column 7, Line 36, delete "hard-disk drives (HDD)," and insert -- hard disk drives (HDDs), --, therefor.

In Column 7, Line 38, delete "solid state drives (SSD)," and insert -- solid state drives (SSDs), --, therefor.

In Column 7, Line 48, delete "digital versatile disks (DVD)" and insert -- digital versatile disks (DVDs) --, therefor.

In Column 11, Lines 29-30, delete "matable" and insert -- mateable --, therefor.

Signed and Sealed this  
Twenty-ninth Day of May, 2012

David J. Kappos  
*Director of the United States Patent and Trademark Office*